United States Patent
Nishijima

(10) Patent No.: US 11,538,703 B2
(45) Date of Patent: Dec. 27, 2022

(54) SUBSTRATE HOUSING CONTAINER

(71) Applicant: Achilles Corporation, Tokyo (JP)

(72) Inventor: Masayuki Nishijima, Tokyo (JP)

(73) Assignee: Achilles Corporation, Tokyo (JP)

( * ) Notice: Subject to any disclaimer, the term of this patent is extended or adjusted under 35 U.S.C. 154(b) by 679 days.

(21) Appl. No.: 16/483,589

(22) PCT Filed: Feb. 6, 2017

(86) PCT No.: PCT/JP2017/004232
§ 371 (c)(1),
(2) Date: Aug. 5, 2019

(87) PCT Pub. No.: WO2018/142616
PCT Pub. Date: Aug. 9, 2018

(65) Prior Publication Data
US 2019/0385868 A1    Dec. 19, 2019

(51) Int. Cl.
*G11C 15/04*    (2006.01)
*H01L 21/673*    (2006.01)
(Continued)

(52) U.S. Cl.
CPC ............ *H01L 21/6732* (2013.01); *G11C 5/04* (2013.01); *H01L 21/67769* (2013.01);
(Continued)

(58) Field of Classification Search
CPC .......... H01L 27/6732; H01L 21/67769; H01L 21/67772; H01L 21/68735; H01L 21/68764; G11C 5/04
See application file for complete search history.

(56) References Cited

U.S. PATENT DOCUMENTS 6,533,123 B1    3/2003  Nakamura et al.
7,021,574 B2 *  4/2006  Berger ................... E03C 1/266
                                                241/46.016
(Continued)

FOREIGN PATENT DOCUMENTS

WO    2018/142616 A1    8/2018

OTHER PUBLICATIONS

International Search Report and Written Opinion for PCT/JP2017/004232 dated May 9, 2017.

*Primary Examiner* — Pho M Luu
(74) *Attorney, Agent, or Firm* — K&L Gates LLP; Louis C. Cullman; Giorgios N. Kefallinos

(57) ABSTRACT

A substrate housing container (1) includes (i) a container body (10) having one end that is provided with an opening (11) and another end that is provided with a mount element (12) on which substrates (W) are stacked, the mount element 12 facing the opening (11), and (ii) a cover (20) to cover the opening (11), wherein the cover (20) includes a lid portion (21) to cover the opening (11) and at least two holding members (22) disposed on the lid portion (21), the holding members (22) being configured to swing in a central direction of the lid portion (21) and to press outer sides of the substrates (W) accommodated in the container body (10) with the substrates (W) stacked, the container body (10) has guide grooves (13) to make tips (22a) of the holding members (22) move from an outer side of the mount element (12) to an inner sides of the mount element (12) to guide the tips (22a) of the holding members (22) to positions at which the holding members (22) press the outer sides of the substrates (W), and the guide grooves (13) are formed as a dent on surfaces of the mount element (12).

4 Claims, 8 Drawing Sheets

(51) Int. Cl.
*H01L 21/677* (2006.01)
*H01L 21/687* (2006.01)
*G11C 5/04* (2006.01)

(52) U.S. Cl.
CPC .. *H01L 21/67772* (2013.01); *H01L 21/68735* (2013.01); *H01L 21/68764* (2013.01)

(56) References Cited

U.S. PATENT DOCUMENTS

| | | | |
|---|---|---|---|
| 7,750,591 B2* | 7/2010 | Wang | B65F 1/1638 |
| | | | 49/66 |
| 7,876,575 B2* | 1/2011 | Hosokawa | H01L 21/67383 |
| | | | 206/706 |
| 10,985,043 B2* | 4/2021 | Narita | H01L 21/67376 |
| 2004/0045263 A1 | 3/2004 | Haggard et al. | |
| 2010/0236977 A1 | 9/2010 | Pylant et al. | |
| 2017/0025294 A1 | 1/2017 | Ozawa et al. | |

* cited by examiner

SUBSTRATE HOUSING CONTAINER

CROSS REFERENCE TO RELATED APPLICATION(S)

This application is a national phase filing of PCT/JP2017/004232, filed Feb. 6, 2017, the entire disclosure of which is incorporated herein by reference.

TECHNICAL FIELD

The present disclosure relates to a substrate housing container.

BACKGROUND ART

Substrate housing containers for accommodating a substrate include a container that is disclosed, for example, in Patent Literature 1 and used for accommodating semiconductor wafers.

A substrate housing container disclosed in Patent Literature 1 includes a substrate housing member that is tubular and disposed on a body of the container. The substrate housing member includes cushioning elements or the like that are disposed on the top and the bottom of the substrate housing member. Wafers and spacer sheets (such as synthetic resin sheets, clean papers, or molded articles made of synthetic resin) are arranged alternately between the top-side cushioning element and the bottom-side cushioning element to be accommodated in the substrate housing member, and then a cover is placed over the substrate housing member.

CITATION LIST

Patent Literature

Patent Literature 1: Unexamined Japanese Patent Application Kokai Publication No. H09-129719

SUMMARY OF INVENTION

Technical Problem

In order to accommodate the wafers in the substrate housing container disclosed in Patent Literature 1, the inner diameter of the substrate housing member is to be larger than the outer diameters of the wafers. As a result, due to gaps between the substrate housing member and the wafers, a vibration, an impact or the like occurring during transportation of the container causes horizontal movements of the wafers.

The container disclosed in Patent Literature 1 has a problem that such horizontal movements of the wafers cause rubs with the spacer sheets directly coming into contact with the wafers, the breakage of the wafers such as scratch or crack, dust generation, and chemical damage of the wafers by a chemical substance.

The present disclosure is developed in consideration of the aforementioned circumstances, and an objective of the present disclosure is to provide a substrate housing container enabling prevention of movements of substrates accommodated in the container.

Solution to Problem

In order to attain the aforementioned objective, a substrate housing container according to the present disclosure includes: a container body having one end that is provided with an opening and another end that is provided with a mount element on which substrates are stacked, the mount element facing the opening; and a cover to cover the opening, wherein the cover includes a lid portion to cover the opening and at least two holding members disposed on the lid portion, the holding members being configured to swing in a central direction of the lid portion and to press outer sides of the substrates accommodated in the container body with the substrates stacked, the container body has guide grooves to make tips of the holding members move from an outer side of the mount element to an inner sides of the mount element to guide the tips of the holding members to positions at which the holding members press the outer sides of the substrates, and the guide grooves are formed as a dent on a surface of the mount element.

The container body preferably includes fixing side walls defining a storage space in which the substrates are accommodated, the fixing side walls being spaced on the mount element, the guide grooves are preferably formed on portions of the mount element that are located between the fixing side walls, and the cover preferably includes the holding members arranged at positions of the lid portion that correspond to the portions of the mount element that are located between the fixing side walls.

The holding members are preferably formed integrally with the cover or preferably have grooves that are formed along swinging axis portions about which the the holding members swing and that facilitate the swings of the holding members.

Advantageous Effects of Invention

According to the present disclosure, movements of the substrates accommodated in the container can be prevented.

DESCRIPTION OF EMBODIMENTS

Figure 1A:
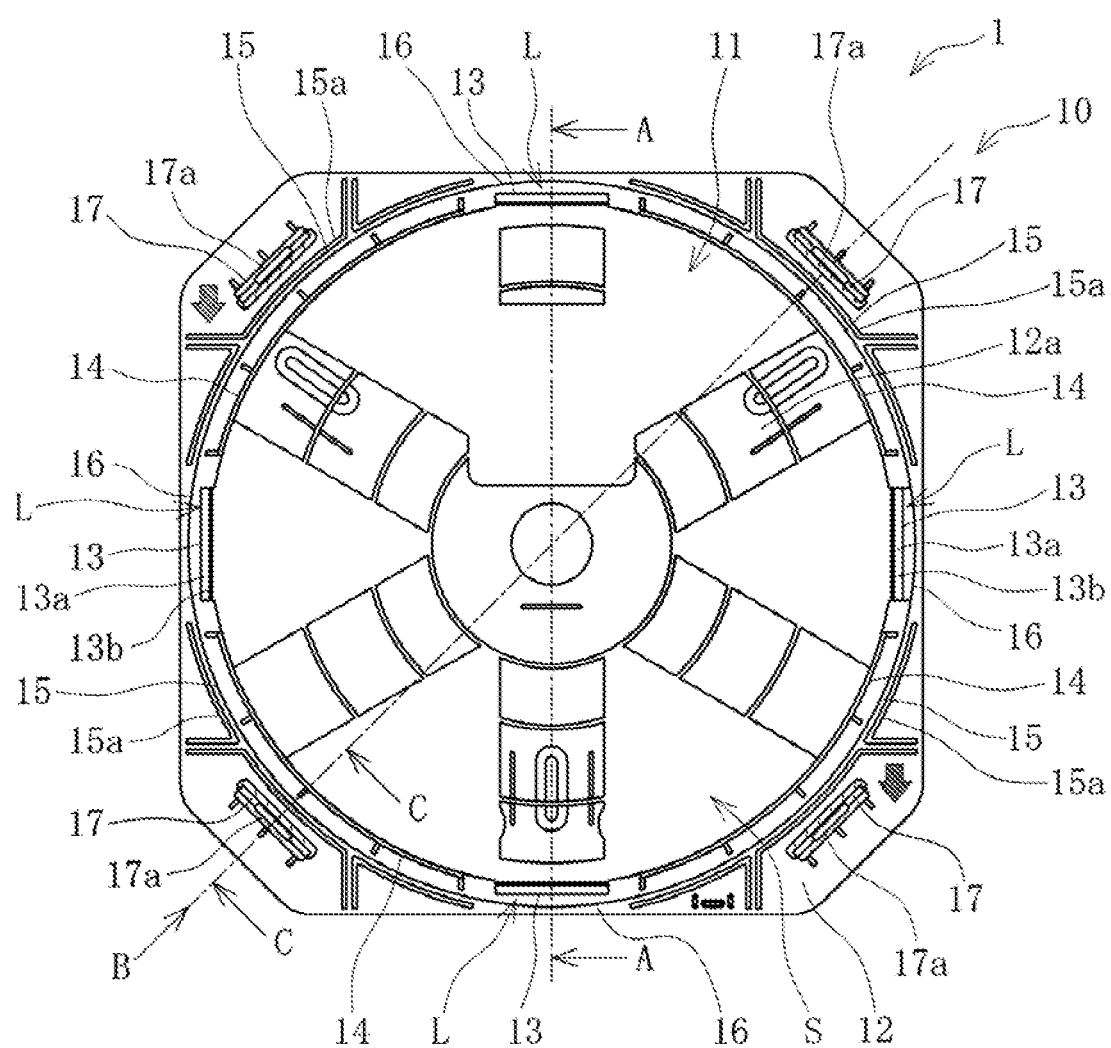
FIG. 1A is a plane view illustrating a container body of an embodiment of a substrate housing container of the present disclosure.

An embodiment of the substrate housing container of the present description is described below in detail with reference to the drawings.

A substrate housing container 1 according to the present disclosure includes: a container body 10 having one end that is provided with an opening 11 and another end that is provided with a mount element 12 that faces the opening 11 and on which substrates W are stacked; and a cover 20 to cover the opening 11, wherein the cover 20 includes a lid portion 21 to cover the opening 11 and at least two holding members 22 disposed on the lid portion 21, the holding members 22 are configured to swing in a central direction of the lid portion 21 and to press outer sides of the substrates W accommodated in the container body 10 with the substrates W stacked, the container body 10 has guide grooves 13 to make tips 22a of the holding members 22 move from the outer side of the mount element 12 toward the inner side of the mount element 12 to guide the tips 22a of the holding members 22 to positions at which the holding members 22 press the outer sides of the substrates W, and the guide grooves 13 are formed as a dent on a surface of the mount element 12.

As a result, when the cover 20 is placed over the container body 10, the tips 22a of the holding members 22 are guided by the guide grooves 13 of the container body 10 to move from the outer side to the inner side. In this case, the tips 22a prevent movements of the substrates W by pressing at least two portions of the outer sides of the substrates W that are arranged in a stack.

In the present embodiment described below, the opening 11 of the container body 10 opens upward and the horizontal substrates W are stacked on the mount element 12. After placing the substrates W in the substrate housing container 1 in a stack and then covering the substrate housing container 1 with the cover 20, the substrate housing container 1 can be transported while being in any position (for example, flat surfaces of the substrates W may be perpendicular to the horizontal direction or the vertical direction).

The container body 10 includes the mount element 12 serving as a bottom plate. As illustrated in FIG. 1A, the mount element 12 has an octagonal shape that is obtained by cutting four corners of a square. The mount element 12 includes substrate mounting portions 12a that are flat and are separated from one another on the central region of the upper surface of the mount element 12, and the substrates W are stacked on the substrate mounting portions 12a. The mount element 12 may have a quadrilateral shape.

The mount element 12 includes fixing side walls 14 defining a storage space S for accommodating the substrates W and the fixing side walls 14 protrude upward. The fixing side walls 14 each have a circular-arc shape to form portions of a cylindrical tube in accordance with the shapes of the substrates W, and the number of the fixing side walls 14 is, for example, four. The fixing side walls 14 are arranged on the circumference of a circle and at intervals. The fixing side walls 14 are formed integrally with the mount element 12. As a result, the upper edges of the fixing side walls 14 form the opening 11 of the container body 10, and the space defined by the fixing side walls 14 serves as the storage space S.

The cylindrical tube partially formed by the fixing side walls 14 has such an inner diameter as does not pose an obstacle to the placement of the substrates W in the storage space S or the removal of the substrates W from the storage space S. The cylindrical tube partially formed by the fixing side walls 14 has an inner diameter larger than the sizes (diameters) of the substrates W (for example, an inner diameter larger than the diameters of the substrates W by 1 to 2 mm), for example, an inner diameter of 5 inch, 6 inch, 8 inch or 12 inch. Interval spaces L between the fixing side walls 14 serve as an insertion slot through which a robot arm for grasping the substrates W is inserted in the storage space S.

Figure 1B:
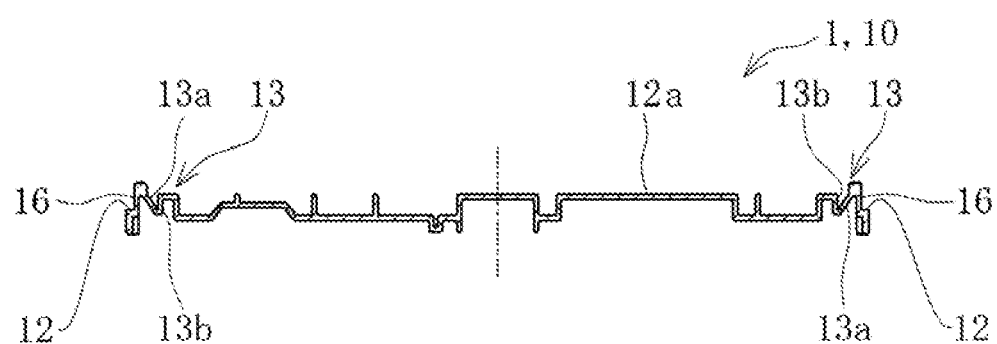
FIG. 1B is a cross sectional view taken along the A-A line illustrated in FIG. 1A.
Figure 2A:
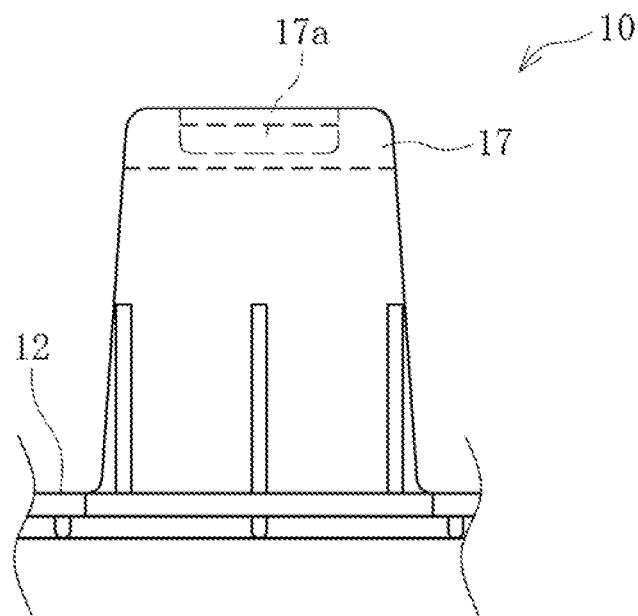
FIG. 2A is a view illustrating an engagement piece of the embodiment of the substrate housing container of the present disclosure and is a view taken along in the direction of an arrow B illustrated in FIG. 1A.
Figure 2B:
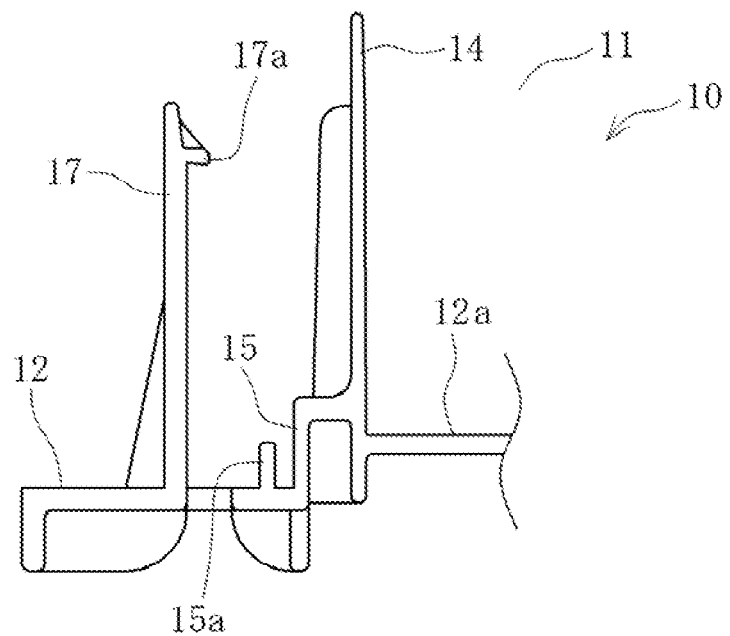
FIG. 2B is a cross sectional view taken along the C-C line illustrated in FIG. 1A.

As illustrated in FIG. 2B, the container body 10 has sealing surfaces 15 for the cover 20 that are located on the outer circumferences of the lower ends of the fixing side walls 14. Protrusions 15a protruding upward are formed on the outer sides of the sealing surfaces 15 and in a circular-arc shape. As illustrated in FIG. 1B, sealing surfaces 16 protruding upward from the mount element 12 are formed in the interval spaces L between the fixing side walls 14. The sealing surfaces 16 connect to the sealing surfaces 15 and have a ring shape. The protrusions 15a are not formed on the outer sides of the sealing surfaces 16.

As a result, when the container body 10 is covered with the cover 20 described below, the substrate housing container 1 is sealed by causing the inner side surface of the cylindrical portion 23 of the cover 20 to come into contact with the sealing surfaces 15 and 16. The substrate housing container 1 is kept sealed by pressing the outer side surfaces of the cylindrical portion 23 of the cover by the protrusions 15a.

As illustrated in FIGS. 1 and 2, the container body 10 includes engagement pieces 17 that are located on the outer sides of the four corresponding fixing side walls 14 located in the four corners of the mount element 12. Each of the engagement pieces 17 includes a nail portion 17a that is located on the tip of each of the engagement pieces 17. The nail portion 17a is formed integrally with the mount element 12 and protrudes upward. The container body 10 is kept connected to the cover 20 by the nail portions 17a of the engagement pieces 17. The cover 20 is described below in detail.

As illustrated in FIG. 1, the container body 10 has the guide grooves 13. The guide grooves 13 are formed on the four potions corresponding to the interval spaces L between the fixing side walls 14 of the mount element 12. The guide grooves 13 guide the tips 22a to make the tips 22a move from the outer side of the mount member 12 to the inner side of the mount member 12 (the central side) when the holding members 22 included in the lid portion 21 of the cover 20 swing about bases 22b.

The guide grooves 13 are shaped like a straight line and are perpendicular to the central direction of the mount element 12 that serves as a bottom plate. The guide grooves 13 are formed as a dent on the surfaces of the substrate mounting portions 12a. The guide grooves 13 each have an approximately V-shaped cross section consisting of a slope portion 13a and a vertical portion 13b, and the slope portion 13a slopes up from the central side of the container body 10 toward the outer side of the container body 10 and the vertical portion 13b connects to a central-side portion of the slope portion 13a.

Regarding the container body 10, as illustrated in FIGS. 1 and 2, the mount element 12 and the fixing side walls 14 may each have an uneven portion, a rib, and the like for reinforcement of these elements or handling in another process if necessary. These elements may be formed integrally with the container body 10.

Figure 3A:
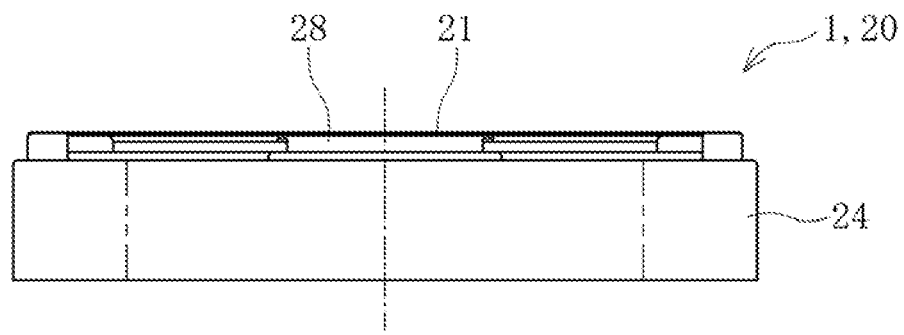
FIG. 3A is a front view illustrating a cover of the embodiment of the substrate housing container of the present disclosure.
Figure 3B:
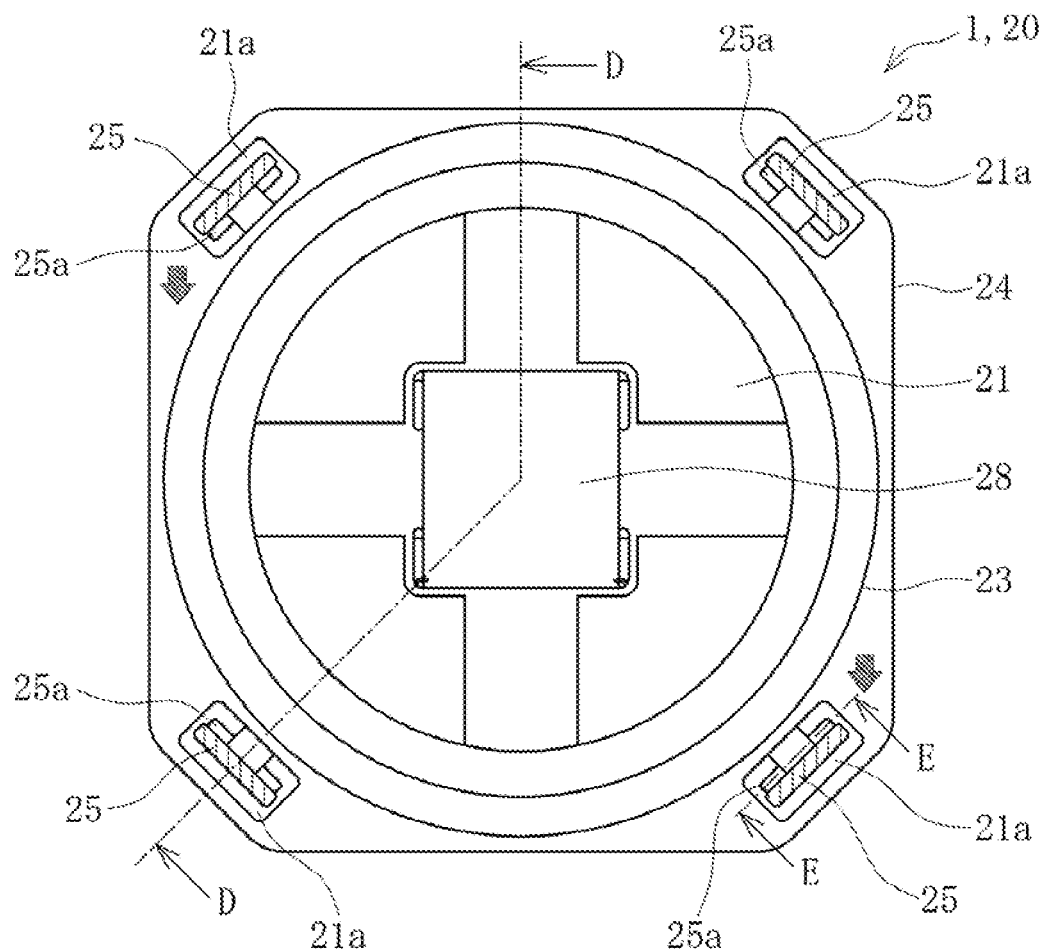
FIG. 3B is a plane view of the cover.
Figure 4:
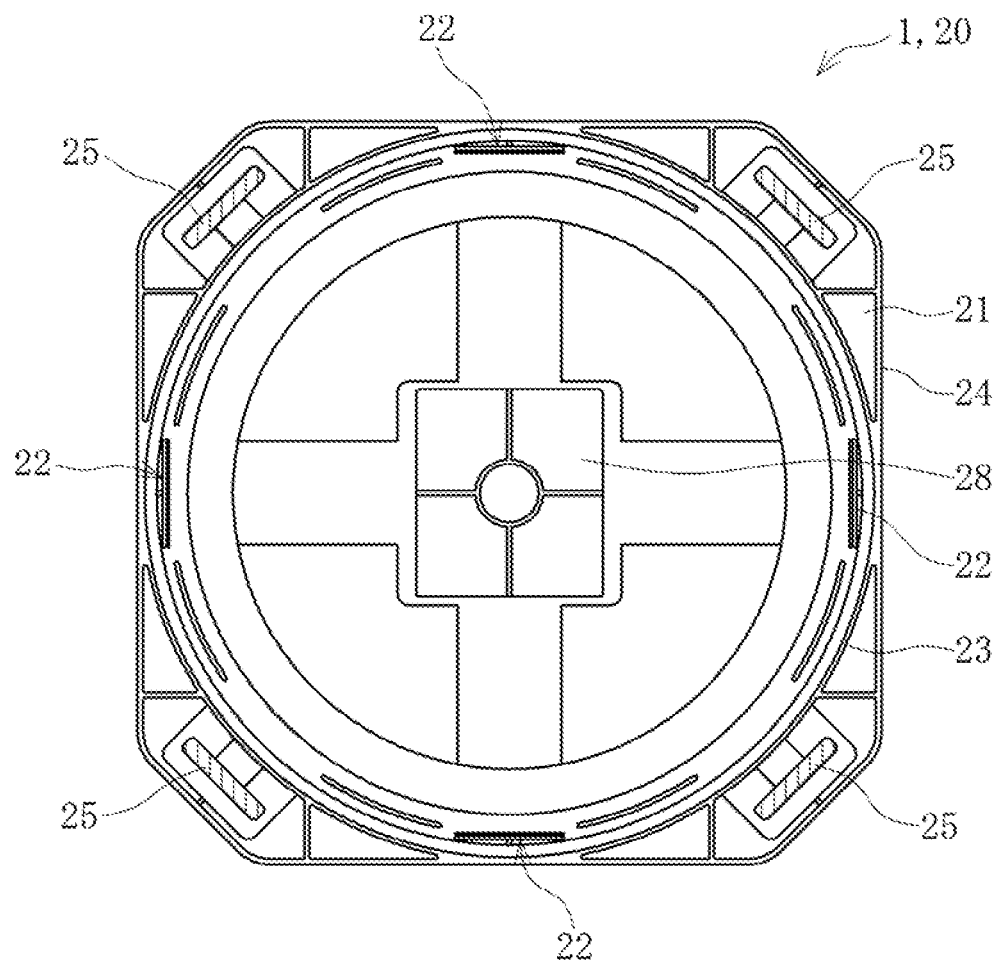
FIG. 4 is a bottom view of the cover of the embodiment of the substrate housing container of the present disclosure.
Figure 5:
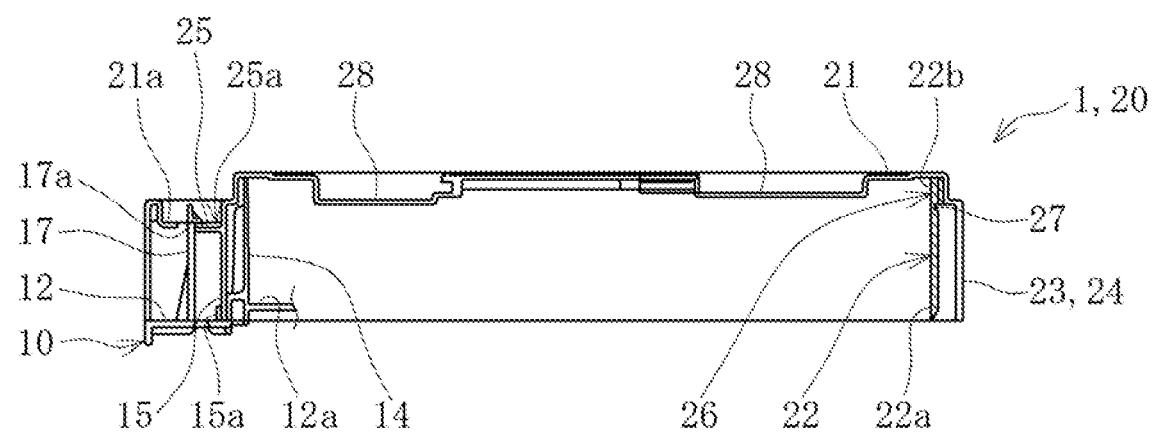
FIG. 5 is a cross sectional view illustrating a portion of the cover and a portion of the container body of the embodiment of the substrate housing container of the present disclosure and is a cross sectional view taken along the D-D line illustrated in FIG. 3B.

As illustrated in FIGS. 3 to 5, the cover 20 is placed over the container body 10 to cover the opening 11. The cover 20 includes the lid portion 21 that serves as a top board having an octagonal contour shape similar to that of the mount element 12.

The lid portion 21 has an outer wall portion 24 protruding from the circumference of the octagonal shape of the lid portion 21, and the the outer wall portion 24 comes into contact with a lip portion formed to surround the lateral surface of the mount element 12 of the container body 10. The cylinder-shaped cylindrical portion 23 is formed on the inner side of the outer wall portion 24 of the lid portion 21 and protrudes from the lid portion 21 that serves as a top board. The cylindrical portion 23 can seal the substrate housing container 1 by making the cylindrical portion 23 come into contact with the sealing surfaces 15 and 16 of the mount member 12 of the container body 10.

The lid portion 21 has engagement holes 25 that are formed on the four corners of the lid portion 21, and the four corners of the lid portion 21 correspond to the positions of the engagement pieces 17 of the container body 10. After the nail portions 17a of the engagement portions 17 protruding upward from the mount element 12 of the container body 10 pass through the engagement holes 25, the horizontal surfaces of the lower ends of the nail portions 17a mesh with the lid element 21.

Figure 6:
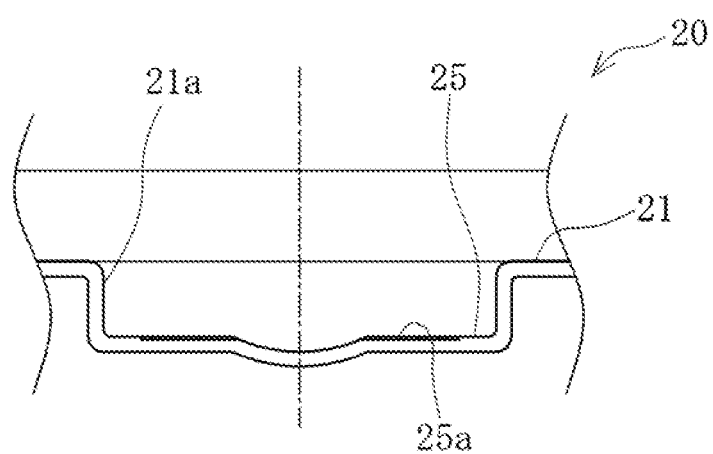
FIG. 6 is a cross sectional view illustrating the cover of the embodiment of the substrate housing container of the present disclosure and is a cross sectional view taken along the E-E line illustrated in FIG. 3B.

As illustrated in FIG. 6, concave portions 21a formed on the upper surface of the lid portion 21 are provided with the engagement holes 25. As illustrated in FIG. 5, the concave portions 21a each have a sufficient depth to enable the concave portions 21a to accommodate the nail portions 17a in order to avoid the protrusions of the engagement portions 17 from the surface of the lid portion 21 after the engagement portions 17 pass through the engagement holes 25. Engagement regions 25a of the engagement holes 25 that mesh with the nail portions 17a are formed in a way that the engagement portions 17 are easily pressed back when the engagement regions 25a are disengaged from the nail portions 17a by bending engagement regions 25a inward.

As a result, when the cover 20 is placed over the container body 10, the nail portions 17a of the four engagement portions 17 of the container body 10 mesh with the engagement regions 25a by making the nail portions 17a pass through the engagement holes 25a of the cover 20.

In this state in which the nail portions 17a mesh with the engagement regions 25a, the storage space S for the substrates W is sealed with the container body 10 and the cover 20.

Also, concave portions of the central portions of the engagement regions 25a of the cover 20 are used for disengaging the nail portions 17a from the engagement regions 25a. The use of these concave portions enable the engagement pieces 17 to be securely pressed from the central side toward the outer side, thereby enabling easy disengagement from the engagement regions 25a.

The cover 20 includes at lease two or four holding members 22 that are arranged on the outer side of the substrates W.

The holding members 22 are shaped like a flat plate. The holding members 22 protrude downward from the inner side of the lid portion 21 that serves as a top board, and the holding members 22 are arranged at positions perpendicular to the central direction of the lid portion 21. The holding members 22 are formed to swing about swinging axis portions 26 of the bases 22b, and the swinging axis portions 26 each serve as a hinge by forming the holding members 22 integrally with the cover 20.

In this embodiment, the holding members 22 each have a groove 27 that is formed on the outer portion of the swinging axis portions 26. As a result, the portions the holding members 22 serving as a hinge become thin due to the grooves 27 formed in the swinging axis portions 26. Accordingly, the holding members 22 can easily swing about the grooves 27, and the guide grooves 13 can smoothly guide the holding members 22.

Positions of the swinging axis portions 26 are determined such that the inner-side surfaces of the holding members 22 (the surfaces that face the central side of the substrates W) are located at positions at which the inner-side surfaces of the holding members 22 fit the outer diameters of the stacked substrates W that are accommodated in the container body 10. The protrusion lengths of the holding members 22 are determined in the following manner. When the cover 20 is placed over the container body 10, the tips 22a (the lower ends illustrated in the drawing) of the holding members 22 are located in the guide grooves 13 of the container body 10 at the initial stage of the process of the placement of the cover 20 over the container body 10 (refer to FIG. 7A). Afterward, the holding members 22 are guided by the guide grooves 13 as the process of the placement of the cover 22 over the container body 10 progresses. The protrusion lengths of the holding members 22 are determined such that the holding members 22 are guided until the inner-side surfaces of the holding members 22 come into contact with the vertical portions 13b of the guide grooves 13 at the final stage of the process of the placement of the cover 20 over the container body 10, that is, in a state in which the container body 10 is completely covered with the cover 20 (refer to FIG. 7B).

That is, in the state in which the cover 20 is placed over the container body 10 and thus the substrate housing container 1 is sealed, the tips 22a of the holding members 22 are located at tip portions of the guide grooves 13 and thus cannot return to the outer side due to the slope portion 13a.

As a result, in the state in which the cover 20 is placed over the container body 10 and thus the substrate housing container 1 is sealed, the four holding members 22 are kept located at the positions at which the inner-side surfaces of the holding members 22 fit the outer diameters of the stacked substrates W. Accordingly, the four holding members 22 can press the outer surfaces of the substrates W, thereby securely preventing horizontal movements of the substrates W.

The holding members 22 are located between (i) the lid portion 21 serving as a top board of the cover 20 and (ii) the guide grooves 13 formed by making dents in the mount element 12 serving as a bottom plate of the container body 10. As a result, all of the substrates W stacked on the substrate mounting portions 12a can be pressed, and even a substrate W located at the lowest position can be securely held.

Also, the container body 10 from which the cover 20 is removed does not include the holding members 22. Accordingly, the substrates W can be accommodated in the container body 10 in the same manner as before and without disturbance by the holding members 22.

As illustrated in FIGS. 3 to 5, in the cover 20, the lid portion 21, the cylindrical portion 23 and the outer wall portion 24 are each provided with an uneven portion, a rib, and the like for reinforcement of these elements or handling in another process if necessary. Also, upper pressing portions 28 for vertically pressing the substrates W stacked on the substrate mounting portions 12a of the container body 10 are formed integrally with the top board of the lid portion 21. The upper pressing portions 28 vertically press the stacked substrates W between the substrate mounting portions 12a and the lid portion 21 in the same manner as before. The above-described portions of the cover 20 may be formed integrally with one another.

In the substrate housing container 1, the container body 10 and the cover 20 are preferably made of conductive plastic. Examples of such conductive plastic include plastic to which conductive filler is added, plastic on which polymer alloy processing is performed, and the like. Examples of conductive filler include carbon black, carbon graphite, graphite, carbon fiber, metal powders, metal fiber, metal oxide powders, metal-coated inorganic fine powders, organic fine powders, fiber, and the like.

Figure 8:
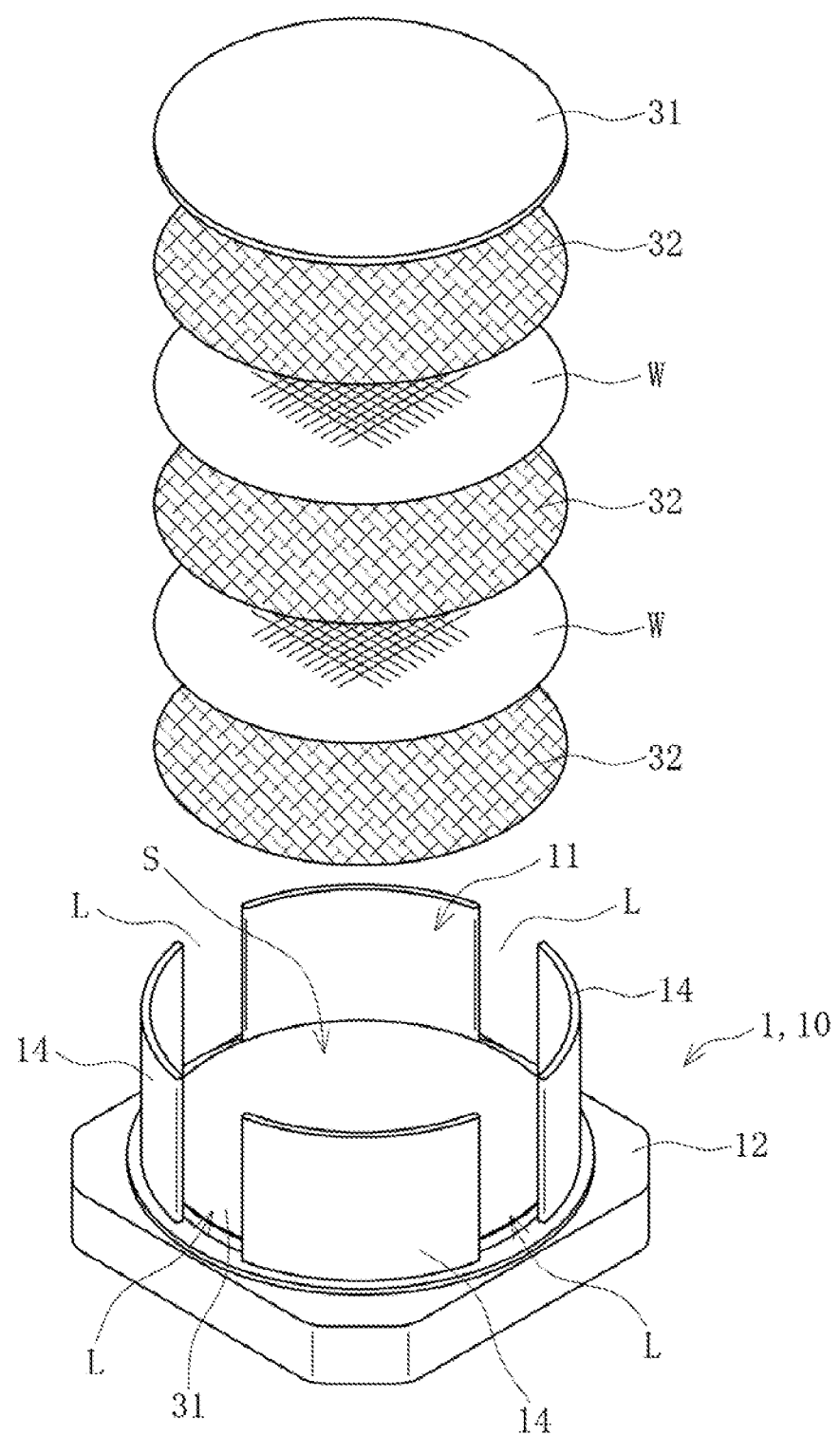
FIG. 8 is an explanatory view illustrating a process of accommodating substrates in the embodiment of the substrate housing container of the present disclosure.

In the substrate housing container 1 configured in such a manner, as illustrated in FIG. 8, a bottom-side cushioning element 31 is first placed on the substrate mounting portions 12a surrounded by the four fixing side walls 14 of the container body 10, other substrates W and spacer sheets 32 are stacked on the bottom-side cushioning element 31 alternatingly, and then a top-side cushioning element 31 is placed on the stack of these substrates W and spacer sheets 32, and thus the substrates W are accommodated in the container body 10 in such a manner.

After accommodating the given number of the stacked substrates W in the container body 10, the cover 20 is placed over the container body 10.

Figure 7A:
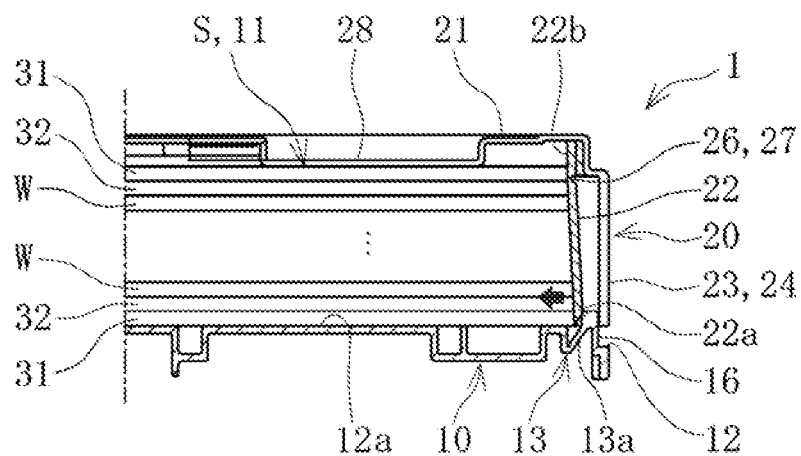
FIG. 7 is an explanatory view illustrating a movement of a holding member of the embodiment of the substrate housing container of the present disclosure.

As illustrated in FIG. 7A, in the state in which the tip portion of the cylindrical portion 23 of the cover 20 comes into contact with the sealing surfaces 16 of the container body 10 during the process of placement of the cover 20 over the container body 10, the tips 22a of the holding members 22 of the cover 20 are located in the guide grooves 13 of the container body 10.

When the process of placement of the cover 20 over the container body 10 further progresses, the tips 22a of the pressing elements 22 are guided by the slope portions 13a of the guide grooves 13 to move from the outer side toward the central side. The pressing elements 22 swing about the swinging axis portions 26 of the bases 22b.

Figure 7B:
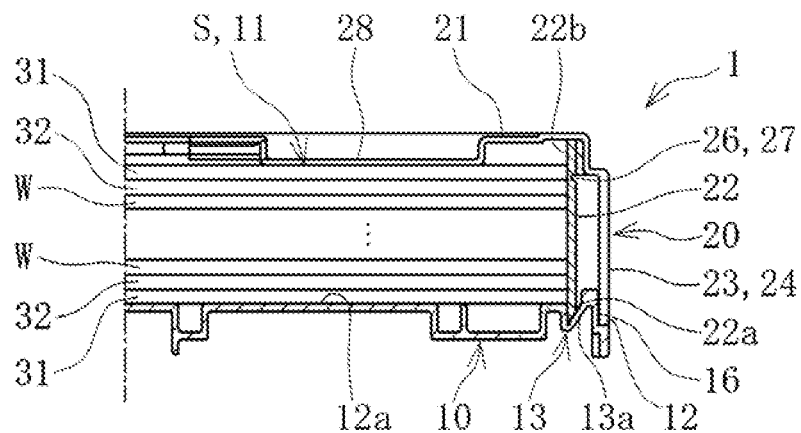

In the state in which the container body 10 is completely covered with the cover 20, as illustrated in FIG. 7B, the holding members 22 come into contact with the central-side vertical portions 13b of the guide grooves 13. At this time, the inner-side surfaces of the holding members 22 are located at the positions at which the holding members 22 come into contact with the outer surfaces of the substrates W.

As a result, the four holding members 22 can hold the outer sides (the outer side surfaces) of the stacked substrates W, thereby preventing the horizontal movements of the substrates W.

Additionally, the upper surfaces of the substrate mounting portions 12a of the container body 10 and the upper pressing portions 28 of the lid portion 21 of the cover 20 press the stacked substrates W, thereby also preventing the vertical movements of the substrates W.

Additionally, in this state in which the container body 10 is completely covered with the cover 20, the cylindrical portion 23 of the cover 20 comes into contact with the sealing surfaces 15 and 16 of the container body 10, thereby sealing the substrate housing container 1.

Also, after the nail portions 17a of the engagement pieces 17 of the container body 10 pass through the engagement holes 25 of the cover 20, the nail portions 17a mesh with the engagement regions 25a, thereby keeping the cover 20 connected with the container body 10.

After the substrates W are stacked to be accommodated in the container body 10 and then the cover 20 is placed over the container body 10, the substrates W accommodated in the storage space S are horizontally and vertically fixed. Accordingly, even though the substrate housing container 1 is transported in any direction, the substrates W do not move any more, thereby preventing rubs with the spacer sheets directly coming into contact with the substrates W, the breakage of the wafers such as scratch or crack, dust generation, and chemical damage of the wafers by a chemical substance W.

The substrate housing container according to the present disclosure includes: the container body 10 having one end that is provided with the opening 11 and another end that is provided with the mount element 12 on which the substrates W are stacked and that faces the opening 11; and the cover 20 to cover the opening 11, wherein the cover 20 includes the lid portion 21 to cover the opening 11 and at least two holding members 22 disposed on the lid portion 21, the holding members 22 are configured to swing in a central direction of the lid portion 21 and to press outer sides of the substrates W accommodated in the container body 10 with the substrates W stacked, the container body 10 has the guide grooves 13 to make the tips 22a of the holding members 22 move from an outer side of the mount element 12 to an inner sides of the mount element 12 to guide the tips 22a of the holding members 22 to positions at which the holding members 22 press the outer sides of the substrates W, and the guide grooves 13 are formed as a dent on surface of the mount element 12. Accordingly, in the substrate housing container 1 of the present disclosure, the holding members 22 hold the substrates W accommodated in the container body 1 from the both sides of the substrates W, thereby enabling prevention of the movements of the substrates W.

Also, the tips 22a of the holding members 22 are guided by the guide grooves 13 formed as a dent on the mount element 12 so that the holding members 22 hold the substrates W, thereby making it possible to hold the outer sides (the outer surfaces) of all of the substrates on the mount element 12. As a result, even thin substrates W can be securely held, thereby enabling prevention of the movements of the substrates W.

In the substrate housing container 1 of the present disclosure, the container body 10 includes the fixing side walls 14 defining the storage space S in which the substrates W are accommodated, the fixing side walls 14 are spaced on the mount element 12, the guide grooves 13 are formed on the portions of the mount element 12 that are located between the fixing side walls 14, and the cover 20 includes the holding members 22 arranged at positions of the lid portion 21 that correspond to the portions of the mount element 12 that are located between the fixing side walls 14. Accordingly, the guide grooves 13 and the holding members 22 are formed by using the interval spaces L between the fixing side walls 14. As a result, none of the guide grooves 13 and the holding members 22 are hindrances to placement of and removable of the substrates W in and from the container body 10, and thus the substrates W can be placed in or removed from the container body 10 in the same manner as before.

A conventional housing container of the prior art has a hinge structure in which movable side walls can swing about a vertical axis in a fixing side wall, and the movable side walls are pressed toward the central side to press substrates by placing a cover over a container body of the conventional housing container. In this case, gaps sufficient to enable the movable side walls to swing must be formed between the movable walls and a surface of a mount element of the container body. As a result, the movable side walls is to move upward from the surface of the mount element by the lengths of the gaps. Accordingly, in a case in which substrates each having a certain thickness are accommodated in the conventional housing container, such a case may cause the problem that a bottom-side substrate of the substrates cannot be held by the movable side walls.

However, in the substrate housing container 1 of the present disclosure, the tips 22a of the holding members 22 are located at the positions lower than the surface of the mount element 12, thereby making it possible to hold all of the holding elements 22 independently of the thicknesses of the substrates.

Additionally, in the conventional housing container, when the substrates are placed in the container body, there is a fear that the movable side walls might touch the substrates accommodated in the conventional housing container if the movable side walls do not return to their original positions.

However, in the substrate housing container 1 of the present disclosure, the cover 20 is provided with the holding members 22. Accordingly, none of the holding members 22 exist in the container body 10 when the substrates W are placed in the container body 10, and thus none of the holding members 22 touch the substrates during the placement of the substrates W in the container body 10, thereby making it possible to place the substrates W in the container body 10 in the same manner as before.

Additionally, the interval spaces L between the fixing side walls 14 can be also used as an insertion slot through which the robot arm for grasping the substrates W is inserted in the storage space S.

In the substrate housing container 1 of the present disclosure, the holding members 22 are formed integrally with the cover 20. Accordingly, the substrate housing container 1 of the present disclosure does not require assembly of the holding members 22 or adjustment of the positions of the holding members 22, thereby making it possible to securely hold the stacked substrates W accommodated in the container body 10.

In the substrate housing container 1 of the present disclosure, the holding members 22 includes the swinging axis portions 26 that are provided with the grooves 27 for facilitating the swings of the holding members 22. As a result, the switching axis portions 26 of the holding members 22 that each serve as a hinge each have a thin thickness, and thus the holding members 22 can easily swing about the grooves 27, thereby making it possible to smoothly guide the holding members 22 by the guide grooves 13.

In the above-described embodiment, the number of the holding members 22 is four. Alternatively, at least two holding members 22 may be formed diagonally on the cover 20. Additionally, three or more holding members 22 may be formed on the cover 20, thereby making it possible to securely hold the substrates W.

In the above-described embodiment, one flat plate-shaped holding member 22 is formed at one portion of the cover 20. Alternatively, one flat plate-shaped holding member 22 formed at one portion of the cover 20 may be divided into flat plate-shaped holding portions that can swing perpendicularly to the center of the cover 20. As a result, the substrates W can be securely held by the flat-shaped holding portions obtained by dividing each of the flat plate-shaped holding members 22.

Additionally, ridges protruding toward the substrates W-side may be formed, for example, on the both edges of the surface of each of the holding members 22 in the width direction to make it possible to hold the substrates W not only by the central portions of the holding members 22 but also by the ridges on the both side edges. Alternatively, a protrusion portion protruding toward the substrates W may be formed on the surface of each of the flat plate-shaped holding members 22 by making a dent in the surface of each of the holding members 22 and the substrates W may be held by the protrusion portions formed on the surfaces of the holding members 22. One or more protrusion portions may be formed on the surface of each of the holding members 22. Alternatively, the surfaces of the flat plate-shaped holding members 22 that come into contact with the substrates W may each include a curved surface portion having a shape approximately the same as the shapes of the outer circumferences of the substrates W, and the substrates W may be held by the curved surface portions.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The substrate housing container according to the present disclosure can be preferably used as, for example, a substrate housing container for accommodating semiconductor wafers.

REFERENCE SIGNS LIST

1 Substrate housing container
10 Container body
11 Opening
12 Mount element
12a Substrate mounting portion
13 Guide groove
13a Slope portion
13b Vertical portion
14 Fixing side wall
15 Sealing surface
15a Protrusion
16 Sealing surface
17 Engagement piece
17a Nail portion
20 Cover
21 Lid portion
21a Concave portion
22 Holding member
22a Tip
22b Base
23 Cylindrical portion
24 Outer wall portion
25 Engagement hole
25a Engagement region
26 Swinging axis portion
27 Groove
28 Upper pressing portion 31 Cushioning element
32 Spacer sheet
L Interval space
S Storage space
W Substrate

The invention claimed is:

1. A substrate housing container comprising:
a container body having one end that is provided with an opening and another end that is provided with a mount element on which substrates are stacked, the mount element facing the opening, and wherein the container body further comprises fixing side walls defining a storage space in which the substrates are accommodated, the fixing side walls being spaced on the mount element; and
a cover to cover the opening, wherein
the cover includes a lid portion to cover the opening and at least two holding members disposed on the lid portion, the at least two holding members being configured to swing in a central direction of the lid portion and to press outer sides of the substrates accommodated in the container body with the substrates stacked, and wherein the at least two holding members arranged at positions of the lid portion that correspond to the portions of the mount element are located between the fixing side walls,
the container body has guide grooves to make tips of the holding members move from an outer side of the mount element to an inner side of the mount element to guide the tips of the holding members to positions at which the holding members press the outer sides of the substrates, and
the guide grooves are formed on portions of the mount element that are located between the fixing side walls.

2. The substrate housing container according to claim 1, wherein the holding members are formed integrally with the cover.

3. The substrate housing container according to claim 1, wherein
the holding members have grooves (i) that are formed along swinging axis portions about which the holding members swing and (ii) that facilitate the swings of the holding members.

4. The substrate housing container according to claim 2, wherein
the holding members have grooves (i) that are formed along swinging axis portions about which the holding members swing and (ii) that facilitate the swings of the holding members.

* * * * *